(12) United States Patent
Mitsui et al.

(10) Patent No.: US 11,041,930 B2
(45) Date of Patent: Jun. 22, 2021

(54) MAGNETIC RESONANCE IMAGING APPARATUS AND ABNORMALITY DETECTION METHOD

(71) Applicant: CANON MEDICAL SYSTEMS CORPORATION, Otawara (JP)

(72) Inventors: Shinji Mitsui, Nasushiobara (JP); Keiji Tahira, Chigasaki (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 520 days.

(21) Appl. No.: 15/969,843

(22) Filed: May 3, 2018

(65) Prior Publication Data

US 2018/0329011 A1    Nov. 15, 2018

(30) Foreign Application Priority Data

May 10, 2017    (JP) .............................. JP2017-094059

(51) Int. Cl.
   *G01R 33/58*    (2006.01)
   *G01R 33/56*    (2006.01)
   (Continued)

(52) U.S. Cl.
   CPC ........... *G01R 33/583* (2013.01); *G01R 33/36* (2013.01); *G01R 33/3614* (2013.01);
   (Continued)

(58) Field of Classification Search
   CPC ............ G01R 33/3614; G01R 33/3642; G01R 33/5608; G01R 33/583; G01R 33/3415; G01R 33/543
   See application file for complete search history.

(56) References Cited

U.S. PATENT DOCUMENTS

| | | | | |
|---|---|---|---|---|
| 7,259,563 B2 * | 8/2007 | Nozaki | .............. | G01R 33/3415 324/307 |
| 7,639,008 B2 * | 12/2009 | Ookawa | ............. | G01R 33/3415 324/307 |

(Continued)

FOREIGN PATENT DOCUMENTS

| | | |
|---|---|---|
| JP | 2-96679 | 4/1990 |
| JP | 6-50606 U | 7/1994 |

(Continued)

*Primary Examiner* — Amy He
(74) *Attorney, Agent, or Firm* — Oblon, McClelland, Maier & Neustadt, L.L.P.

(57) ABSTRACT

According to one embodiment, the MRI apparatus includes an RF coil apparatus having a coil element, a coil port to which the RF coil apparatus is connectible, receive circuitry receiving a signal detected by the RF coil apparatus via the coil port when neither an RF pulse nor a gradient magnetic field is being applied, and performing A/D conversion with an A/D converter, and processing circuitry detecting an abnormality based on the signal. With the RF coil apparatus being connected to the coil port, the receive circuitry switches at least one switch provided in a section between the coil element and the A/D converter between on and off, and receives the signal. The processing circuitry compares a signal of a path where the coil element and A/D converter are connected with a signal of a path where the coil element and A/D converter are not connected, and detects the abnormality.

10 Claims, 9 Drawing Sheets

(51) Int. Cl.
    *G01R 33/36*         (2006.01)
    *G01R 33/54*         (2006.01)
    *G01R 33/3415*     (2006.01)

(52) U.S. Cl.
    CPC ..... *G01R 33/3621* (2013.01); *G01R 33/3642* (2013.01); *G01R 33/3657* (2013.01); *G01R 33/3664* (2013.01); *G01R 33/5608* (2013.01); *G01R 33/3415* (2013.01); *G01R 33/543* (2013.01)

(56) References Cited

U.S. PATENT DOCUMENTS

| | | |
|---|---|---|
| 2006/0181278 A1 | 8/2006 | Nozaki |
| 2012/0226141 A1* | 9/2012 | Shinoda ................ G01R 33/48 600/419 |

FOREIGN PATENT DOCUMENTS

| | | |
|---|---|---|
| JP | 2006-223383 | 8/2006 |
| JP | 2009-165538 | 7/2009 |
| JP | 2014-207943 | 11/2014 |
| JP | 2015-202255 | 11/2015 |

\* cited by examiner

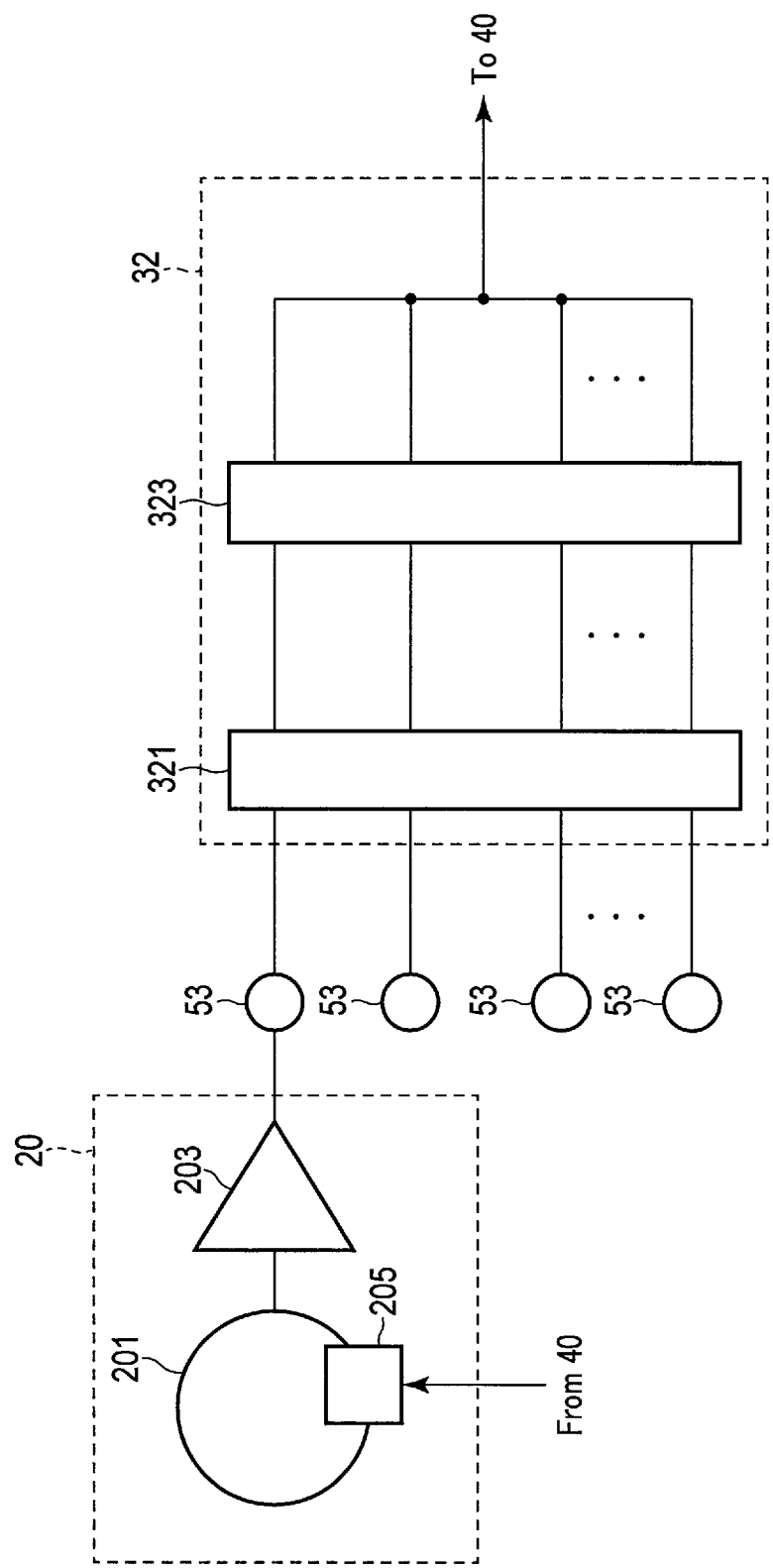
F I G. 2

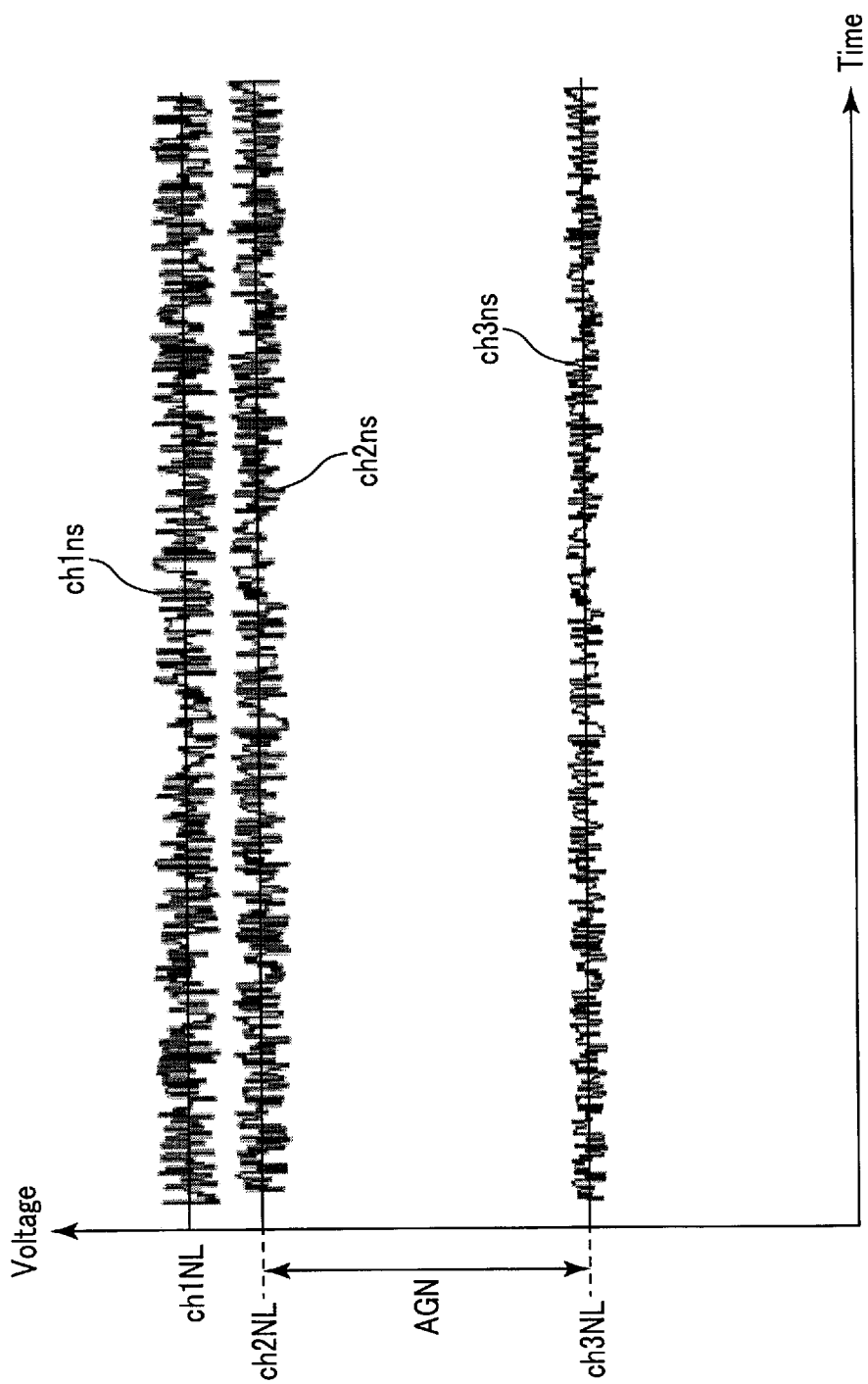
F I G. 6

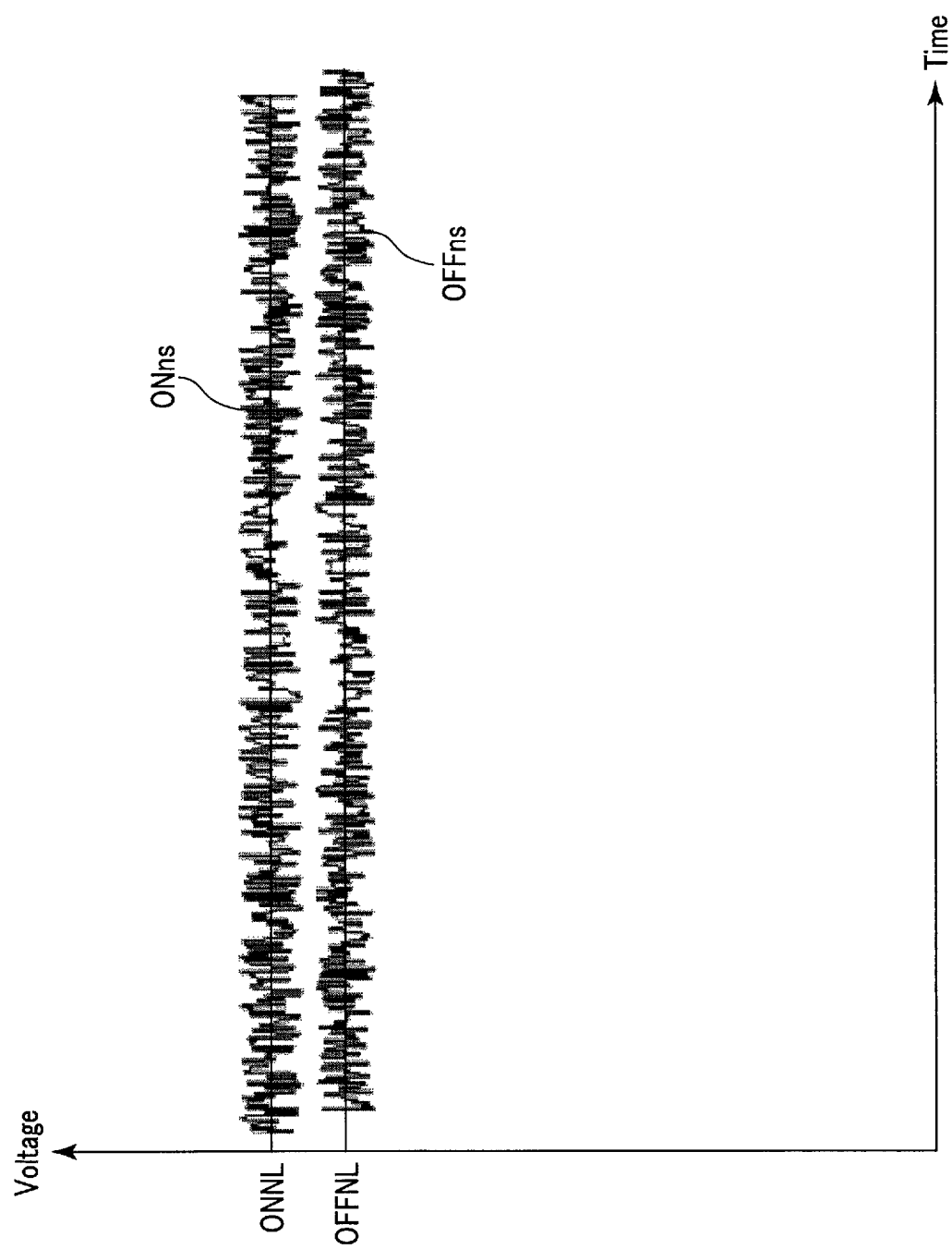
F I G. 8

MAGNETIC RESONANCE IMAGING APPARATUS AND ABNORMALITY DETECTION METHOD

CROSS-REFERENCE TO RELATED APPLICATIONS

This application is based upon and claims the benefit of priority from the prior Japanese Patent Application No. 2017-094059, filed May 10, 2017, the entire contents of which are incorporated herein by reference.

FIELD

Embodiments described herein relate generally to a magnetic resonance imaging apparatus and an abnormality detection method.

BACKGROUND

As a conventional method of checking presence/absence of a malfunction in a radio frequency (RF) coil of a magnetic resonance imaging (MRI) apparatus, a phantom is sometimes used to measure a signal-to-noise ratio (SNR). Specifically, when image quality checking in a regular inspection of an MRI apparatus is carried out, or when an abnormal image, such as an image with degraded image quality, is generated, a phantom is set in an RF coil, and SNR measurement is performed.

If a measured SNR value does not reach a specification value, there is a problem of not being able to determine whether an abnormality occurs in an MRI apparatus itself (i.e., in a system) or in an RF coil at the time of performing the SNR measurement. Because a spot where the abnormality occurs cannot be determined, it would take time for an inexperienced serviceman to isolate the abnormality, or an unnecessary repair cost may be involved if he changes a normal RF coil or other parts by mistake.

Furthermore, since a plurality of RF coils are used in the MRI apparatus in accordance with an imaging target, there are a plurality of phantoms for SNR measurement. Since it is thus difficult for an operator to remember a combination of RF coils and phantoms and to remember procedures of setting phantoms, the operator cannot carry out SNR measurement remotely or without an operator present, and has to carry out SNR measurement by reading a manual. For such reasons, the SNR measurement is a complicated process.

BRIEF DESCRIPTION OF THE DRAWINGS

FIG. 2 is a block diagram showing a configuration example related to an RF coil apparatus and receive circuitry in the present embodiment.

FIG. 6 is a diagram showing an example of a first noise level in each of three receive channels and an example of a gain of an amplifier in the abnormality detection function according to the present embodiment.

FIG. 8 is a diagram showing an example of a fourth noise level and a fifth noise level corresponding to a coil element in the abnormality detection function according to the present embodiment.

DETAILED DESCRIPTION

According to one embodiment, a magnetic resonance imaging apparatus includes an RF coil apparatus, a coil port, receive circuitry, and processing circuitry. The RF coil apparatus has a coil element. The RF coil apparatus is connectable to the coil ports. The receive circuitry receives a signal detected by the RF coil apparatus via the coil port when neither an RF pulse nor a gradient magnetic field is being applied, and performs analog to digital conversion with an analog to digital converter. The processing circuitry detects an abnormality based on the signal received by the receive circuitry.

With at least one RF coil apparatus being connected to the coil ports, the receive circuitry switches at least one switch provided in a section between the coil elements and the analog to digital converter between on and off, and receives the signal. The processing circuitry compares a signal of a first path where the coil element and the analog to digital converter are connected, with a signal of a second path where the coil element and the analog to digital converter are not connected, and detects the abnormality.

The purpose of this is to provide a magnetic resonance imaging apparatus capable of detecting an abnormality and a method of detecting an abnormality.

In the following descriptions, the magnetic resonance imaging apparatus according to the present embodiment will be described with reference to the drawings.

In the description below, structural elements having substantially the same functions and configurations will be denoted by the same reference symbols, and a repetitive description of such elements will be given as necessary.

Figure 1:
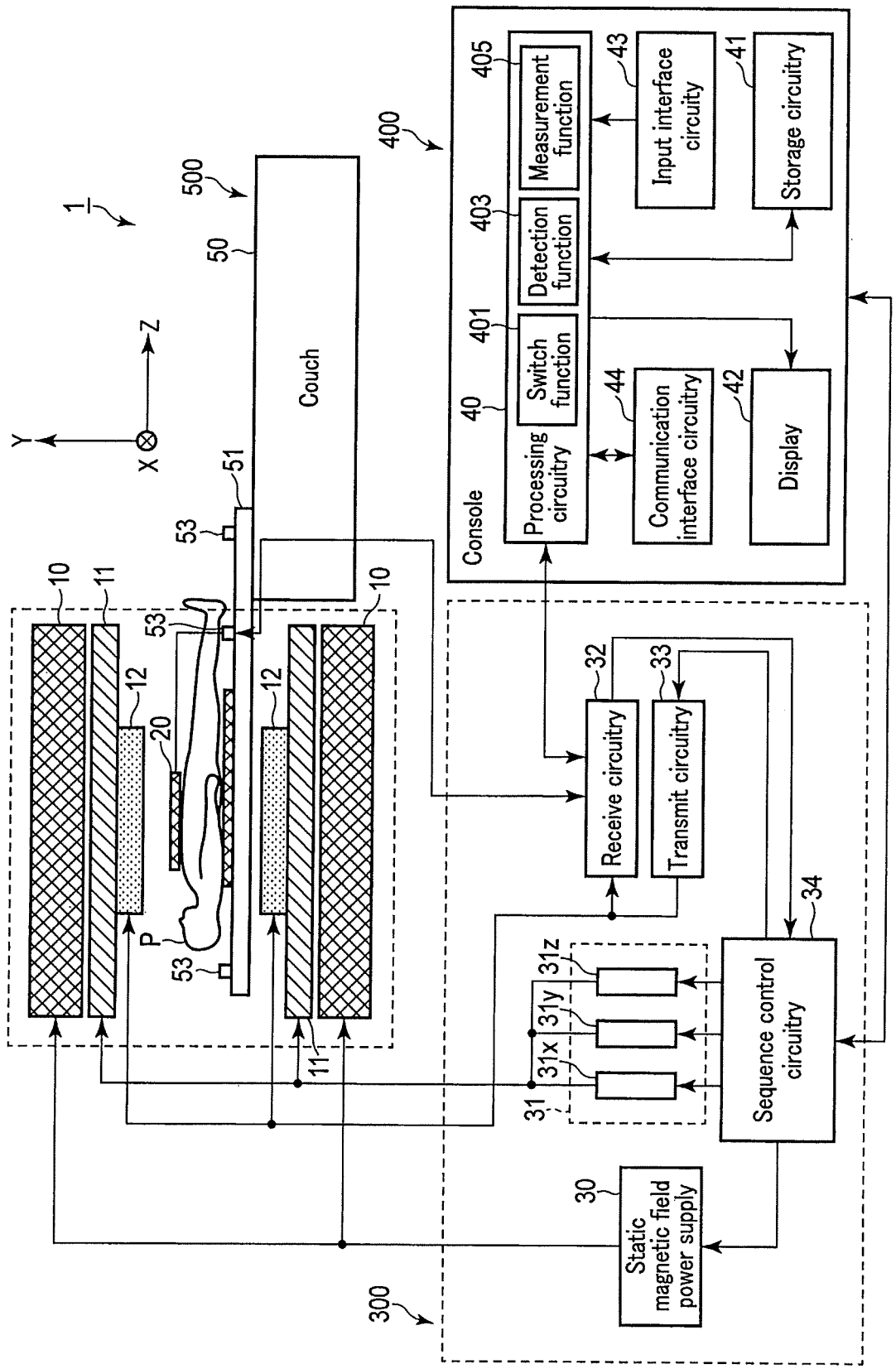
FIG. 1 is a block diagram schematically showing an overall configuration of a magnetic resonance imaging apparatus according to an embodiment.

FIG. 1 is a block diagram schematically showing an overall configuration of a magnetic resonance imaging apparatus 1 according to an embodiment. The magnetic resonance imaging apparatus 1 includes a gantry 100, a couch 500, a control cabinet 300, a console 400, a whole body (WB) coil 12, and a radio frequency (RF) coil apparatus 20.

The gantry 100 includes a static magnetic field magnet 10, a gradient coil 11, and a WB coil 12, and these structures are stored in a housing having an approximately cylindrical shape. The couch 500 includes a couch main body 50 and a couch top 51.

The control cabinet 300 includes a static magnetic field power supply 30, a gradient magnetic field power supply 31 (31x for an X-axis, 31y for a Y-axis, and 31z for a Z-axis), receive circuitry 32, transmit circuitry 33, and sequence control circuitry 34.

The static magnetic field magnet 10 of the gantry 100 has an approximately cylindrical shape, and generates a static magnetic field inside a bore in which a subject P, for example, a patient, is carried through. The bore is a space inside the cylinder constituting the gantry 100. The static magnetic field magnet 10 includes, for example, a superconductive coil. The superconductive coil is cooled to an extremely low temperature with liquid helium.

The static magnetic field magnet 10 generates a static magnetic field by applying a current supplied from the static magnetic field power supply 30 to the superconductive coil when the magnet is in an excitation mode. When the static magnetic field magnet shifts to a permanent current mode after a static magnetic field is generated, the magnet is disconnected from the static magnetic field power supply 30. Once the magnet shifts to the permanent current mode, the static magnetic field magnet 10 continues generating a static magnetic field for a long time, for example, a year. The static magnetic field magnet 10 is herein explained as a superconductive magnet; however, a permanent magnet may be used to form a static magnetic field. The static magnetic field magnet 10 is not necessarily in an approximately cylindrical shape; it may be formed in an open shape.

The gradient coil 11 also has an approximately cylindrical shape, and is fixed inside the static magnetic field magnet 10. The gradient coil 11 applies a gradient magnetic field to a subject P in each of an X-axis direction, a Y-axis direction, and a Z-axis direction, using a current supplied from the gradient magnetic field power supply (31x, 31y, 31z).

The couch main body 50 of the couch 500 can move the couch top 51 in a vertical direction and a horizontal direction. The couch main body 50 moves a subject P lying on the couch top 51 to a predetermined height before imaging is carried out. When the couch top is moved to the predetermined height, the couch main body 50 moves the subject P into the bore by moving the couch top 51 in a horizontal direction when imaging is carried out.

A plurality of coil ports 53 to which the RF coil apparatus 20 is connected are provided in the couch top 51. A connector which is provided on the distal end of the cable in the RF coil apparatus 20 is connected to one or each of some coil ports of the plurality of coil ports. In other words, the RF coil apparatus is connectible to the coil ports 53. Each of the plurality of coil ports 53 has a plurality of terminals corresponding to a plurality of coil elements (loops) of the RF coil apparatus 20. For example, the number of the plurality of the terminals is larger than the number of coil elements.

A place where the coil ports 53 are arranged is not limited to the couch top 51; the coil ports 53 may be placed in the couch main body 50 or in the gantry 100, etc.

The WB coil 12, sometimes called a whole body coil, has an approximately cylindrical shape and is fixed inside of the gradient coil 11, surrounding a subject P. The WB coil 12 transmits an RF pulse transmitted from the transmit circuitry 33 to a subject P. The WB coil 12 receives magnetic resonance (MR) signals emitted from a subject P caused by excitation of, for example, hydrogen nuclei.

The MRI apparatus 1 includes the RF coil apparatus 20 in addition to the WB coil 12, as shown in FIG. 1. The RF coil apparatus 20 has a plurality of coil elements placed in the proximity of the body surface of a subject P. The RF coil apparatus 20 is, for example, a head coil, a knee coil, an abdomen coil, a breast coil, or a foot coil. The RF coil apparatus 20 may be configured as an RF coil capable of both transmitting and receiving signals but may also be configured as an RF coil dedicated for transmitting or receiving only. The configuration of the RF coil apparatus 20 will be described later in detail.

The transmit circuitry 33 generates an RF pulse based on instructions provided from the sequence control circuitry 34. The generated RF pulse is transmitted to the WB coil 12 or to the RF coil apparatus 20, and is then applied to a subject P. An MR signal is generated in the subject P as a result of applying the RF pulse. The WB coil 12 or the RF coil apparatus 20 receives the MR signal.

FIG. 1 shows that the transmit circuitry 33 is configured to supply an RF pulse to the WE coil 12; however, the RF coil apparatus 20, for example, maybe configured to transmit an RF pulse instead.

The MR signal received by the RF coil apparatus 20, more specifically, the MR signal received by each of the plurality of coil elements in the RF coil apparatus 20, is output to the receive circuitry 32 via the coil ports 53 and the cable that connects the RF coil apparatus 20 to the couch main body 50. The receive circuitry 32 performs AD (analog to digital) conversion on the MR signal, and outputs the MR signal to the sequence control circuitry 34. A specific configuration for performing AD conversion of an MR signal will be described later along with a configuration of the RF coil apparatus 20 described in detail. The digitized MR signal may be referred to as MR data. The MR signal is spatial frequency data before being converted into real-space data by a Fourier transform; accordingly, it may be referred to as "k space data".

The sequence control circuitry 34 performs scanning on a subject P by driving the gradient magnetic field power supply 31, the transmit circuitry 33, and the receive circuitry 32 under the control of the console 400. When the MR data is received from the receive circuitry 32 as a result of the scanning, the sequence control circuitry 34 transmits the received MR data to the console 400.

The sequence control circuitry 34 has a processor that executes a predetermined program. The term "processor" means, for example, a CPU (Central Processing Unit), a GPU (Graphical Processing Unit), an ASIC (Application Specific Integrated Circuit), or a programmable logic device (e.g., an SPLD (Simple Programmable Logic Device), a CPLD (Complex Programmable Logic Device), or an FPGA (Field Programmable Gate Array)). The processor achieves various functions by reading and executing programs from a storage region integrated in circuitry of the processor or the storage circuitry 41. Each processor of the present embodiment is not limited to a processor configured as a single circuit; a plurality of independent circuits may be combined into one processor to realize the functions of the processor.

The console 400 includes the processing circuitry 40, the storage circuitry 41, the display 42, the input interface circuitry 43, and the communication interface circuitry 44. The console 400 functions as a host computer.

The storage circuitry 41 is a storage medium that may be an ROM (read only memory), a RAM (random access memory), or an external storage apparatus, such as an HDD (hard disk drive) and an optical disk apparatus, etc. The storage circuitry 41 stores various information and data and processor-executable programs in the processing circuitry 40.

The input interface circuitry 43 is, for example, a mouse, a keyboard, or a touch panel, and various devices with which an operator inputs various information and data. The display 42 is a display device, such as a liquid crystal display panel, a plasma display panel, and an organic EL panel, and corresponds to a display unit.

The processing circuitry 40 is circuitry having a processor and a memory, for example. The processor realizes various functions, which will be described later, by reading and executing programs stored in the storage circuitry 41. The processing circuitry 40 may also realize various types of functions by combining software processing and hardware processing performed by the processor and the program.

The communication interface circuitry 44 receives and transmits information from and to an external device of the MRI apparatus 1, and facilities, such as a customer service center, a terminal device of a serviceman who deals with the MRI apparatus 1, via a network, such as a LAN (local area network) or the Internet.

The overall configuration of the MRI apparatus 1 according to the present embodiment has been described above. The details of the present embodiment will be explained hereafter.

FIG. 2 is a block diagram showing a configuration example related to the RF coil apparatus 20 and receive circuitry 32 in the present embodiment. For the sake of brevity, the RF coil apparatus 20 shown in FIG. 2 includes one coil element 201, a preamplifier 203 related to the coil element 201, and a decoupling switch 205. The RF coil apparatus 20 has a plurality of coil elements 201, preamplifiers 203 respectively connected to the coil elements 201, and decoupling switches 205 respectively provided in the coil elements 201. Each coil element 201 forms a loop structure when the decoupling switch 205 is in an off state.

Each coil element 201 receives MR signals generated from subject P as a result of applying an RF pulse to the coil element. Each coil element 201 generates signals related to a thermal noise due to its temperature.

The preamplifier 203 amplifies the signals that are output from each coil element 201. The signals amplified by the preamplifier 203 are output to the receive circuitry 32 for each coil element 201 via a plurality of terminals in the coil port 53 arranged in the couch top 51.

The decoupling switch 205 is turned on under the control of the switching function 401 of the processing circuitry 40 when the RF pulse is applied to each coil element 201, in other words, when the RF coil apparatus 20 is in an RF transmitting mode. At this time, a loop structure is cut off in each coil element 201, and an electric coupling in each coil element 201 is disconnected. The decoupling switch 205 is turned off under the control of the switch function 401 when the RF coil apparatus 20 is in a receiving mode for receiving MR signals.

Figure 3:
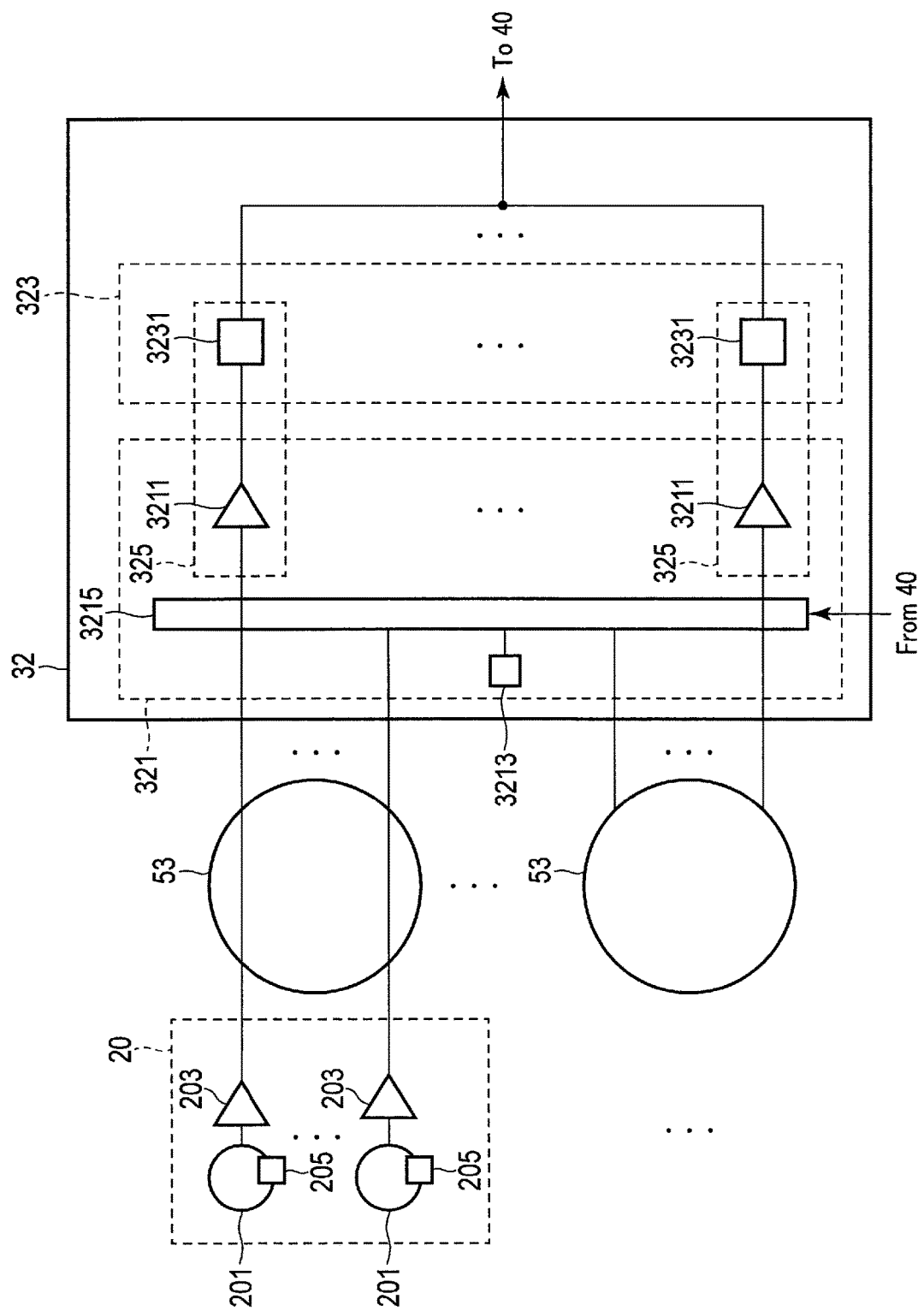
FIG. 3 shows an example of a detailed configuration of the receive circuitry in the present embodiment.

The receive circuitry 32 has a channel allocator 321 and an analog to digital (AD) converter 323. FIG. 3 shows an example of a detailed configuration of the receive circuitry 32. As shown in FIG. 3, signals generated in the plurality of coil elements 201 are output to the receive circuitry 32 via the coil ports 53 to which the RF coil apparatus 20 is connected. The receive circuitry 32 has a plurality of signal paths (hereinafter, receive channels) for each coil port 53. The number of the receive channels corresponds to, for example, the number of the coil elements 201. The number of the receive channels does not necessarily correspond to the number of the coil elements 201; for example, the number may be smaller.

Each receive channel 325 is a signal path consisting of an amplifier 3211, AD converter circuitry 3231, and a detector (not shown). The amplifier 3211 amplifies input signals. The AD converter circuitry 3231 converts input analog signals into digital signals. The detector is provided on the stage before the AD converter circuitry 3231 (the RF coil apparatus side) or the stage thereafter (the processing circuitry side). The detector carries out phase detection on an input signal.

The channel allocator 321 has a plurality of amplifiers 3211, a terminator 3213, and a selector switch 3215. The channel allocator 321 allocates signals that are output from the terminal or the terminator 3213 to each receive channel 325 that is selected by the switch function 401. The channel allocator 321 may be provided in the couch main body 50 or in the gantry 100.

The terminator 3213 is for example a terminator of 50 Ω. The terminator 3213 generates a signal of a heat noise in accordance with its resistance value. A plurality of the terminators 3213 may be provided in the channel allocator 321. The terminator 3213 is not necessarily provided in the channel allocator 321, and may be provided in or outside of the receive circuitry 32.

The selector switch 3215 is a switch for connecting an input from each of the plurality of terminals to each of the plurality of receive channels 325. The selector switch 3215 connects the terminator 3213 to each of the receive channel 325 by the switch function 401. At this time, signals generated at the terminator 3213 are input to each receive channel 325. Thus, the channel allocator 321 allocates an output from each of the coil elements 201 that is input via a terminal, or an output from the terminator 3213 to each of the receive channel 325.

The processing circuitry 40 has various functions related to an abnormality detection function, i.e., the switch function 401, the detection function 403, and the measurement function 405. The abnormality detection function is to detect an abnormal spot in a path from each coil element 201 to each receive channel 325. Specifically, the abnormality detection function is to detect at least one of the following: an abnormal state in each receive channel 325 (the system side of the present MRI apparatus 1), an abnormality in a path between the preamplifier 203 and the selector switch 3215 inclusive, and an abnormality in a path from the coil element 201 to the preamplifier 203. The abnormal state detection method according to the present embodiment is realized by the abnormality detection function which will be described later. The procedures in the abnormality detection function will be described later in detail. The procedures carried out in the switch function 401, the detection function 403, and the measurement function 405 are stored in the storage circuitry 41 in a form of a computer-executable program. The processing circuitry 40 reads a program corresponding to each function from the memory circuitry 41, expands the program on a memory of itself, and executes the program to realize the function corresponding to the program. In other words, reading the programs, the processing circuitry 40 has the functions shown in the processing circuitry 40 of FIG. 1.

It is described with reference to FIG. 1 in the above that those functions are realized in a single processing circuitry 40; however, a plurality of independent processors may be combined to constitute the processing circuitry 40, and the functions may be realized by a program by each of the processors. In other words, each of the above-mentioned functions may be configured as a program, and a single processing circuitry executes each program, or a specific function may be implemented in exclusive, independent program-execution circuitry. The switch function 401, the detection function 403, and the measurement function 405 realized in the processing circuitry 40 are examples of a switch unit, a detection unit, and a measurement unit, respectively.

The processing circuitry 40 controls the selector switch 3215 and the decoupling switch 205 by the switch function 401. Specifically, when the RF coil apparatus 20 is connected to the coil ports 53, the processing circuitry 40 controls the selector switch 3215 to connect each of the terminals to each of the receive channels 325. The processing circuitry 40 controls the decoupling switch 205 so that a loop structure is cut off in each coil element 201 when the RF coil apparatus 20 is in an RF transmitting mode, and controls the decoupling switch 205 so that a loop structure is formed in each coil element 201 when the RF coil apparatus 20 is in an RF receiving mode.

The processing circuitry 40 detects an abnormal state by the detection function 403 based on signals received from the receive circuitry 32. The processing circuitry 40 detects an abnormal spot in a path from each coil element 201 to each receive channel 325 by comparing levels of output signals that are output from each of the receive channels 325 between the receive channels.

The processing circuitry 40 measures a signal to noise ratio (SNR) with the measurement function 405 based on an output from the RF coil apparatus 20 arranged for a phantom. Specifically, the processing circuitry 40 first switches the input to the receive channel 325 from the terminator 3213 to the terminal. The processing circuitry 40 receives, from the sequence control circuitry 34, magnetic resonance signals generated by applying an RF pulse and a gradient magnetic field to a phantom placed in a space suitable for imaging (imaging space) in the vicinity of the center of the magnetic field in the bore. The processing circuitry 40 measures an SNR of the phantom based on the MR data related to the phantom. The processing circuitry 40 reads a predetermined specification value pre-stored as a default value in the storage circuitry 41, from the storage circuitry 41. The processing circuitry 40 determines whether the SNR is smaller than the predetermined specification value or not. The predetermined specification value may be input by a serviceman or an operator via the input interface circuitry 43, etc. If the SNR is smaller than the specification value, the processing circuitry 40 carries out the abnormality detection function.

Figure 4:
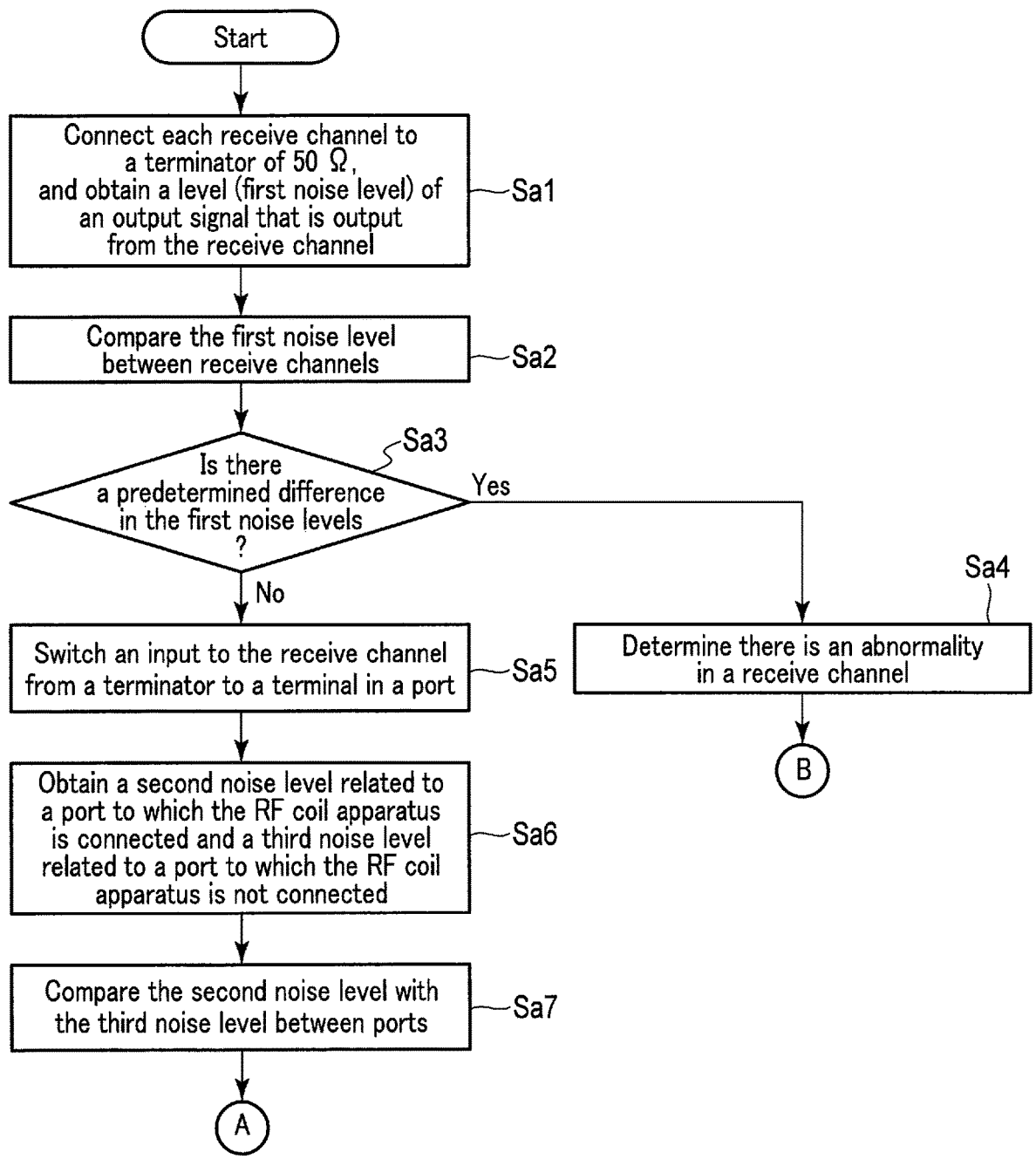
FIG. 4 is a diagram showing an example of a process procedure of an abnormality detection function according to the present embodiment.
Figure 5:
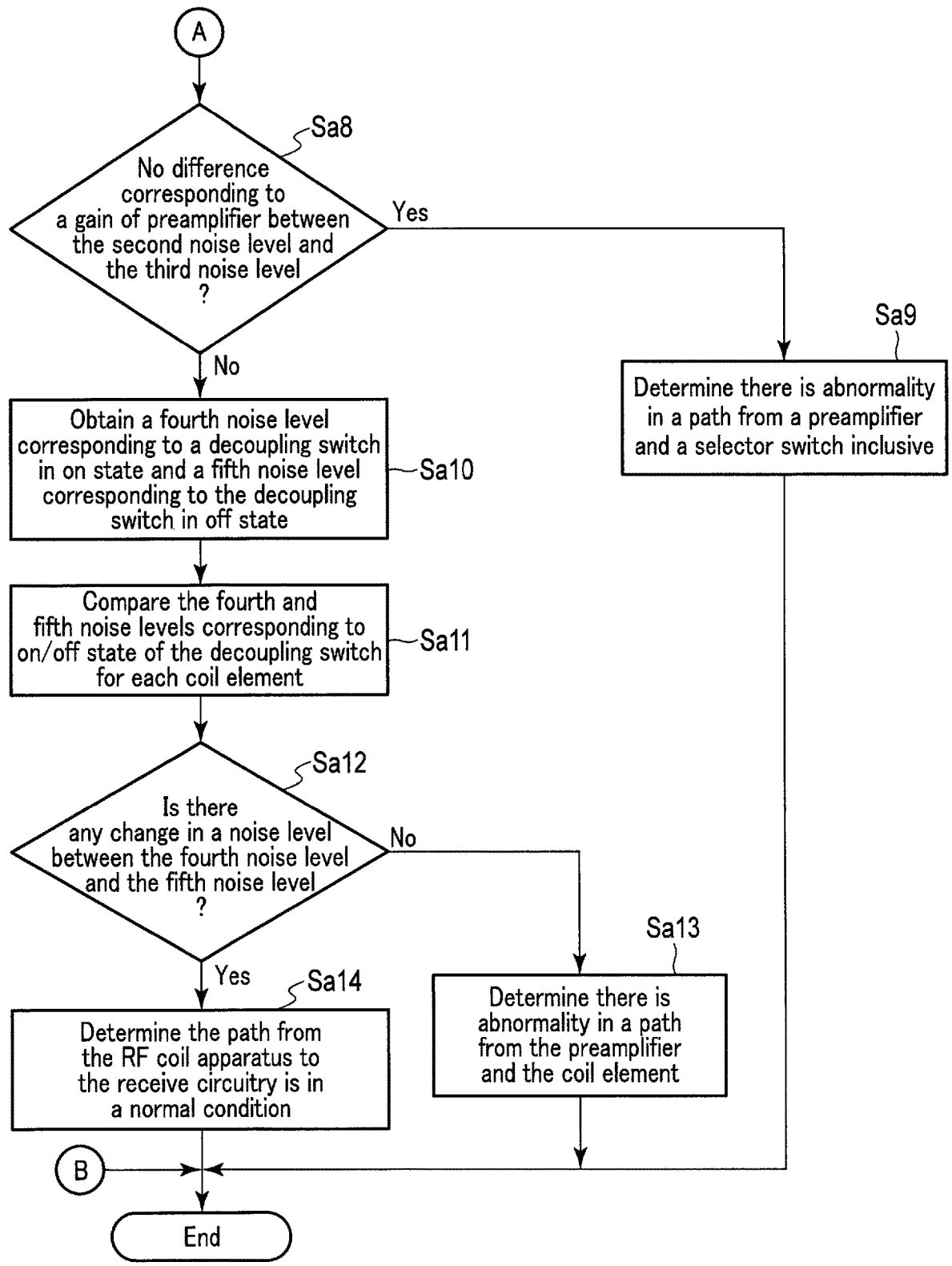
FIG. 5 is a diagram showing an example of a process procedure of an abnormality detection function according to the present embodiment.

In the following, the processing of the abnormality detection function in the present embodiment will be explained. FIGS. 4 and 5 are diagrams showing an example of the procedures of the abnormality detection function.

(Abnormality Detection Function)

(Step Sa1)

The processing circuitry 40 outputs a connection confirmation signal to each of the coil ports 53 to confirm a connection between a coil port 53 and the RF coil apparatus 20. When the RF coil apparatus 20 is connected to a coil port 53, in response to the connection confirmation signal, the RF coil apparatus 20 outputs binary data corresponding to a coil identifier of the RF coil apparatus 20 itself to the processing circuitry 40. The processing circuitry 40 specifies a coil port 53 to which the RF coil apparatus 20 is connected based on the reception of the binary data. The processing circuitry 40 specifies a type of the RF coil apparatus 20 connected to a coil port 53 and the number of channels, etc., by checking a correspondence table of the coil identifiers for the binary data against the binary data that is output from the RF coil apparatus 20. The correspondence table is stored in the memory in the processing circuitry 40 or in the storage circuitry 41. The processing circuitry 40 controls the selector switch 3215 so that each of the plurality of terminals in the specified coil port 53 is connected to each receive channel 325.

With the RF coil apparatus 20 being connected to the coil ports 53, the processing circuitry 40 activates the abnormality detection function. The activation of the abnormality detection function is automatically carried out during a time other than a time for examining a subject P, for example. An example of such a time other than the examination time is a standby time for the MRI apparatus 1 at midnight. With the RF coil apparatus 20 being connected to the coil ports 53, the activation of the abnormality detection function may be carried out in accordance with an instruction that is externally given via the communication interface circuitry 44. When to start activating the abnormality detection function is not limited to a time other than an examination time for a subject P. For example, the abnormality detection function may be carried out upon receiving an instruction from an operator via the input interface circuitry 43.

When the abnormality detection function is activated, the processing circuitry 40 controls the selector switch 3215 by the switch function 401 in such a manner that the connection of each receive channel 325 to each terminal is successively changed to the terminator 3213. At this time, a signal generated at the terminator 3213 is input to the receive channel 325.

The receive circuitry 32 receives a signal detected by the RF coil apparatus 20 (a detection signal) via the coil port 53 when neither an RF pulse nor a gradient magnetic field is applied, and performs analog to digital conversion on the signal with an analog to digital converter 323. Specifically, the receive circuitry 32 receives a first noise generated in the terminator 3213. Specifically, the receive circuitry 32 amplifies the first noise with the amplifier 3211, and converts the amplified signal into a digital signal (hereinafter, a first noise signal) with the AD converter circuitry 3231. The receive circuitry 32 outputs, to the processing circuitry 40, the first noise signal corresponding to the receive channel 325 connected to the terminator 3213.

The processing circuitry 40 temporarily stores a plurality of first noise signals corresponding to a plurality of receive channels in its memory. Preferably, the processing circuitry 40 averages each of the first noise signals over the period of receiving the first noise signals, and stores the averaged noise signals (hereinafter, the first noise levels) for respective receive channels. It is thereby possible to reduce time dispersion in the noise signals over the receiving period. By the above-described processing, the processing circuitry 40 obtains levels of output signals that are output from the receive channels, i.e., first noise levels.

(Step Sa2)

The processing circuitry 40 compares a plurality of first noise levels corresponding to a plurality of receive channels between the receive channels by the detection function 403. The processing circuitry 40 may compare the first noise levels between the receive channels using a gain of the amplifier 3211. At this time, the gain of the amplifier 3211 is stored in the memory of the processing circuitry 40 itself or in the storage circuitry 41 in units of decibels, for example.

(Step Sa3)

The processing circuitry 40 determines if there is a predetermined difference between the first noise levels by comparing the first noise levels between the receive channels. The predetermined difference is, for example, a voltage width corresponding to a gain of the amplifier 3211, or a voltage width defined by standard deviation of a plurality of first noise levels multiplied by a constant number. The predetermined difference is stored in advance in the storage circuitry 41 as a default value. The predetermined difference may be input by a serviceman or an operator via the input interface circuitry 43, etc. Specifically, the processing circuitry 40 specifies a first noise level which falls into outliers (an abnormal value) among the plurality of first noise levels, using the plurality of first noise levels and the predetermined difference. A method of detecting outliers in the first noise levels is not limited to a statistical method using the standard deviation as described above, and various detection methods, such as a method of detecting outliers based on a distance, or a method of detecting outliers by clustering, may be adopted.

If there is the predetermined difference in the first noise levels between the receive channels (Yes in step Sa3), the processing in step Sa4 is performed. If there is no predetermined difference in the first noise levels between the receive channels (No in step Sa3), the processing in step Sa5 is performed.

(Step Sa4)

The processing circuitry 40 determines that the receive channel related to the first noise level which falls into outliers is in an abnormal state. Specifically, if most of the first noise levels of the receive channels exceeding the majority of the total receive channels are at approximately the same level, and a first noise level which falls into outliers is specified, the processing circuitry 40 determines a receive channel related to the specified first noise level as an abnormal receive channel. The processing circuitry 40 displays information of the receive channel determined to be in an abnormal state on the display 42. The processing circuitry 40 may notify a serviceman, etc., of information of the receive channel determined to be in an abnormal state via the communication interface circuitry 44.

FIG. 6 is a diagram showing an example of the first noise levels in three receive channels (ch1, ch2, ch3), and an example of a gain AGN of the amplifier 3211. If those receive channels are in a normal condition, the noise signals generated by the terminator 3213 will be at approximately the same noise level. As shown in FIG. 6, the first noise level ch1NL of the first noise signal ch1ns related to the receive channel ch1 and the first noise level ch2NL of the first noise signal ch2ns related to the receive channel ch2 are at approximately the same noise level. On the other hand, as shown in FIG. 6, the first noise level ch3NL of the first noise signal ch1ns related to the receive channel ch3 is at a voltage lower than a voltage of the first noise level ch1NL and the first noise level ch2NL by a gain AGN of the amplifier 3211. In other words, according to FIG. 6, the first noise level ch3NL related to the receive channel ch3 is an outlier. At this time, the processing circuitry 40 determines that the receive channel ch3 is abnormal. If the first noise level ch3NL is of a value as shown in FIG. 6, a disconnection of a signal line in the receive channel ch3, a malfunction of the selector switch 3215 in the receive channel ch3, and a malfunction of the amplifier 3211 of the receive channel ch3, for example, are displayed on the display 42 by the processing circuitry 40 as information of the receive channel ch3 which is determined to be in an abnormal state.

(Step Sa5)

The processing circuitry 40 determines the stage after the selector switch 3215 (i.e., the receive channel 325 and the processing circuitry 40) is in a normal condition. Subsequently, the processing circuitry 40 controls the selector switch 3215 so that each receive channel 325 is connected to each terminal by the switch function 401.

By this control, the selector switch 3215 switches the input to the receive channel 325 from the terminator 3213 to the terminal of the coil port 53. Specifically, the selector switch 3215 connects a plurality of terminals in the coil port 53 to which the RF coil apparatus 20 is connected to the receive channels by the switch function 401. In addition, the selector switch 3215 connects the plurality of terminals in the coil port 53 to which the RF coil apparatus 20 is not connected to the receive channels by the control in the switch function 401.

(Step Sa6)

A second noise generated in the coil element 201 is input to the plurality of terminals in the coil port 53 to which the RF coil apparatus 20 is connected. The second noise is a thermal noise in accordance with impedance of the coil element 201.

With at least one RF coil apparatus 20 being connected to the coil ports 53, the receive circuitry 32 switches at least one switch (selector switch 3215) provided in a section between the coil element 201 and the analog to digital converter 323 between on and off, and receives the second noise.

Specifically, the receive circuitry 32 receives a second noise while neither RF pulse nor a gradient magnetic field is being applied, and outputs a second noise signal corresponding to the second noise to the processing circuitry 40. The processing circuitry 40 associates an averaged second noise signal (hereinafter, a second noise level) with a coil element 201 that is involved in generating a second noise, and stores the second noise level.

Each of the plurality of terminals in the coil port 53 to which the RF coil apparatus 20 is not connected generates a third noise. The third noise is a thermal noise in accordance with impedance of the coil port 53. At this time, the receive circuitry 32 receives a third noise while neither RF pulse nor a gradient magnetic field is being applied, and outputs a third noise signal corresponding to the third noise to the processing circuitry 40. The processing circuitry 40 stores the averaged third noise signal (hereinafter, the third noise level) for each receive channel.

By the above processing, the processing circuitry 40 thus obtains the second noise level related to a coil port to which the RF coil apparatus 20 is connected and the third noise level related to a coil port to which the RF coil apparatus 20 is not connected.

(Step Sa7)

The processing circuitry 40 compares the second noise level with the third noise level by the detection function 403. Specifically, the processing circuitry 40 compares the noise levels between the coil port to which the RF coil apparatus 20 is connected and the coil port to which the RF coil apparatus 20 is not connected. More specifically, the processing circuitry 40 compares the noise levels between the coil ports and the receive channels in the receive channels connected to the terminals in the coil ports to which the RF coil apparatus 20 is connected and the receive channels connected to the terminals in the coil ports to which the RF coil apparatus 20 is not connected.

(Step Sa8)

The processing circuitry 40 determines if there is a difference corresponding to a gain of the preamplifier 203 between the second noise level and the third noise level. If there is a difference equivalent to a gain of the preamplifier 203 between the second noise level related to the coil ports to which the RF coil apparatus 20 is connected and the third noise level related to the coil ports to which no RF coil apparatus 20 is connected (Yes in step Sa8), in other words, the second noise level and the third noise level are of approximately the same noise level, the processing in step Sa9 is performed. If there is any difference equivalent to a gain of the preamplifier 203 between the second noise level and the third noise level (No in step Sa8), the processing in step Sa10 is carried out.

(Step Sa9)

The processing circuitry 40 specifies a coil element that corresponds to the second noise level which is approximately the same as the third noise level. For the specified coil element, the processing circuitry 40 determines that the path between the preamplifier 203 and the selector switch 3215 inclusive is in an abnormal state. The processing circuitry 40 displays information of the path that is determined to be in an abnormal state on the display 42. The processing circuitry 40 may notify a serviceman, etc., of the information of the path determined to be in an abnormal state through the communication interface circuitry 44.

Figure 7:
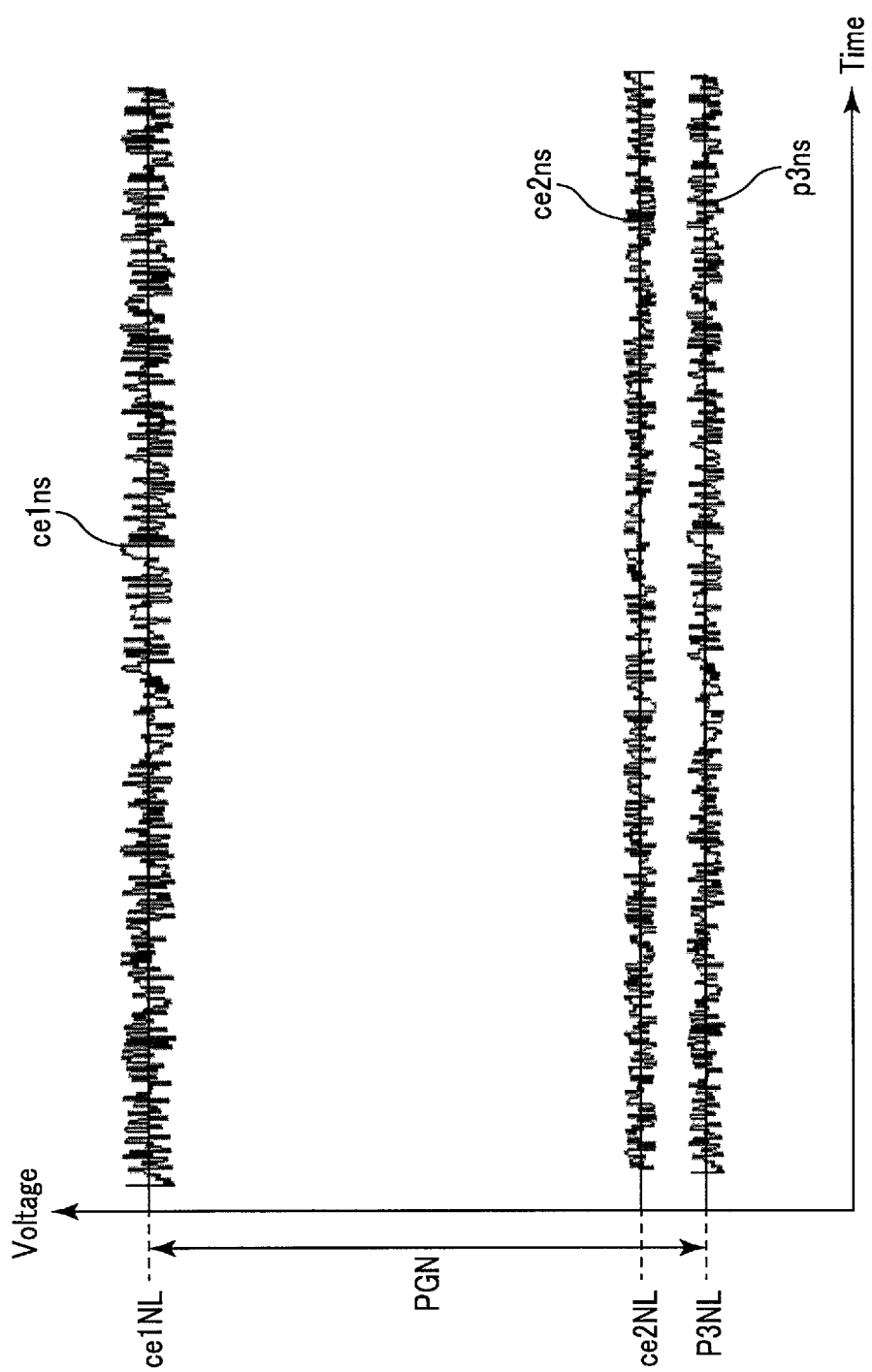
FIG. 7 is a diagram showing an example of two second noise levels related to two coil elements and one third noise level, and a gain of a preamplifier in the abnormality detection function according to the present embodiment.

FIG. 7 is a diagram showing an example of two second noise levels (ce1NL, ce2NL) related to two coil elements, one third noise level P3NL, and a gain PGN of the preamplifier 203. If the path between the preamplifier 203 and the selector switch 3215 inclusive is normal, the second noise level and the third noise level are different for a gain PGN of the preamplifier 203. As shown in FIG. 7, a voltage of the second noise signal ce1NL of the second noise signal ce1ns related to one of the coil elements is, roughly speaking, higher by a gain PGN of the preamplifier 203 than a voltage of the noise level P3NL of the noise signal p3Ns related to a coil port to which the RF coil apparatus 20 is not connected. On the other hand, in FIG. 7, the second noise level ce2NL of the second noise signal ce2ns related to the other coil element and the third noise level P3NL are approximately the same. At this time, for the other coil element, the processing circuitry 40 determines that the path between the preamplifier 203 and the selector switch 3215 inclusive is in an abnormal state. If the second noise level ce2NL is of a value as shown in FIG. 7, for example, a disconnection of a path from the preamplifier 203 to the selector switch 3215 or a malfunction of the preamplifier 203 in the other coil element is displayed on the display 42 by the processing circuitry 40 as information of the path which is determined to be in an abnormal state.

To summarize the processing from step Sa7 to step Sa9, with the detection function 403, the processing circuitry 40 detects an abnormality by comparing a signal of a first path with a signal of a second path where the coil element 201 and the analog to digital converter 323 are not connected, with the coil element 201 and the analog to digital converter 323 being connected. The signal of the first path and the signal of the second path are signals that are output via the amplifier 3211. The signal of the second path is, for example, a signal related to a coil port to which the RF coil apparatus 20 is not connected. The processing circuitry 40 detects an abnormality in the path from the preamplifier 203 to the switch (selector switch 3215) as the above-described abnormality. Specifically, with the detection function 403, the processing circuitry 40 obtains a level of a first path signal by averaging the first path signals over a predetermined period of time, obtains a level of a second path signal by averaging the second path signals over a predetermined period of time, and compares the level of the first path signal and the level of the second path signal, thereby detecting an abnormality.

The signals of the second path may be signals related to terminals to which the coil element 201 is not connected, among the plurality of terminals in the coil port to which the RF coil apparatus 20 is connected. At this time, the processing circuitry 40 detects an abnormality in the path from the coil element 201 to the terminal by the detection function 403 as the above-described abnormality.

(Step Sa10)

The processing circuitry 40 determines the stage after the preamplifier 203 (i.e., the receive channel side) is in a normal condition. Subsequently, the processing circuitry 40 controls the decoupling switch 205 connected to each of the coil elements 201 by the switch function 401 in such a manner that the switch is switched between an on state and an off state. At this time, a fourth noise corresponding to the on state of the decoupling switch 205 and generated in the coil element 201, and a fifth noise corresponding to the off state of the decoupling switch 205 and generated in the coil element 201 are input to the receive channel 325.

In other words, with at least one RF coil apparatus 20 being connected to the coil ports 53, when neither RF pulse nor a gradient magnetic field is applied, the receive circuitry 32 switches at least one switch (decoupling switch 205) provided in a section between the coil elements 201 and the analog to digital converter 323 between on and off to receive the noises. Specifically, the receive circuitry 32 receives the fourth noise and the fifth noise in accordance with the switching at the decoupling switch 205. The receive circuitry 32 outputs a fourth noise signal corresponding to the fourth noise and a fifth noise signal corresponding to the fifth noise to the processing circuitry 40. The processing circuitry 40 stores an averaged fourth noise signal (hereinafter, a fourth noise level) in association with a coil element 201 that is involved in generating a fourth noise and the on state. The processing circuitry 40 stores an averaged fifth noise signal, associating the averaged fifth noise signal (hereinafter, a fifth noise level) with an off state and a coil element 201 that is involved in generating a fifth noise.

By the above-described processing, the fourth noise level corresponding to the decoupling switch 205 in the on state and the fifth noise level corresponding to the decoupling switch 205 in the on state are obtained for all the coil elements.

(Step Sa11)

The processing circuitry 40 compares the fourth noise level with the fifth noise level for the same coil element by the detection function 403. Specifically, the processing circuitry 40 compares the fourth noise and the fifth noise respectively corresponding to the on state and the off state of the decoupling switch for each coil element. The processing circuitry 40 compares the fourth noise level with the fifth noise level for all the coil elements.

(Step Sa12)

The processing circuitry 40 determines if there is a change in the noise level that may be caused by the switching of the decoupling switch 205 with respect to the fourth noise level and the fifth noise level. If there is no change in the fourth noise level corresponding to the decoupling switch 205 in an on state and the fifth noise level corresponding to the decoupling switch 205 in an off state (No in step Sa12), in other words, if there is no change in the fourth noise level and the fifth noise level during the switching of the decoupling switch 205 between the on state and the off state, the processing in step Sa13 is performed. If there is a change in the fourth noise level and the fifth noise level during the switching of the decoupling switch 205 between the on state and the off state (Yes in step Sa12), in other words, if the fourth noise level and the fifth noise level are not at approximately the same noise level, the processing in step Sa14 is performed.

(Step Sa13)

The processing circuitry 40 specifies a coil element where the fourth noise level and the fifth noise level are approximately the same. With respect to the specified coil element, the processing circuitry 40 determines the path from the coil element 201 to the preamplifier 203 is in an abnormal state. The processing circuitry 40 displays information of the path that is determined to be in an abnormal state on the display 42. The processing circuitry 40 may notify a serviceman, etc., of the information of the path determined to be in an abnormal state through the communication interface circuitry 44.

FIG. 8 is a diagram showing an example of the fourth noise level ONNL and the fifth noise level OFFNL corresponding to the coil element 201. If the path from the coil element 201 to the preamplifier 203 is normal, the fourth noise level and the fifth noise level are different. As shown in FIG. 8, the noise level does not change during the switching of the decoupling switch 205. In other words, the fourth noise level ONNL of the fourth noise signal ONns related to the coil element 201 is of the noise level approximately the same as the fifth noise level OFFNL of the fifth noise signal OFFns related to the same coil element 201. At this time, with respect to the coil element 201, the processing circuitry 40 determines the path from the coil element 201 to the preamplifier 203 is in an abnormal state. If the fourth noise level ONNL and the fifth noise level OFFNL are of the values as shown in FIG. 8, the processing circuitry 40 displays, for example, a disconnection of a path from the coil element 201 to the preamplifier 203 on the display 42 as information of the path which is determined to be in an abnormal state.

To summarize the processing from step Sa11 to step Sa13, with the detection function 403, the processing circuitry 40 compares, with respect to the first path in which the coil element 201 and the analog to digital converter 323 are connected, a signal of the first path obtained when the decoupling switch 205 is in an on state with a signal of the first path obtained when the decoupling switch 205 is in an off state for the same coil element 201 thereby further detecting an abnormality in the path from the coil element 201 to the preamplifier 203.

(Step Sa14)

The processing circuitry 40 determines that the path from the RF coil apparatus 20 to the receive circuitry 32 is in a normal condition. The processing circuitry 40 displays on the display 42 that the path is in a normal condition. The processing circuitry 40 may notify a serviceman, etc., that the path is in a normal condition via the communication interface circuitry 44.

In each of the above processing steps, the first to fifth noise signals may be used instead of the first to fifth noise levels. The present abnormality detection function may be periodically and automatically carried out during a time other than the examination time as a part of the maintenance of the present MRI apparatus 1.

According to the above-described configuration, the following advantageous effects can be obtained.

According to the MRI apparatus 1 of the present embodiment, by the processing from step Sa1 to step Sa4 in the abnormality detection function, levels of output signals that are output from the receive channels 325 (first noise levels) are compared between the receive channels after switching the input to the receive channel 325 from a terminal to the terminator 3213, thereby detecting an abnormality in the receive channels 325.

Furthermore, according to the MRI apparatus 1, by the processing from step Sa5 to step Sa9 in the abnormality detection function, after switching the input to the receive channel 325 from a terminal to the terminator 3213, levels of output signals related to, among a plurality of coil ports, the coil ports to which the RF coil apparatus 20 is connected (second noise levels) are compared with levels of output signals related to the coil ports to which the RF coil apparatus 20 is not connected (third noise levels), thereby detecting an abnormality in the path between the preamplifier 203 and the selector switch 3215 inclusive. In other words, according to the MRI apparatus 1, with at least one RF coil apparatus 20 being connected to the coil ports 53, a signal detected by the RF coil apparatus 20 when neither RF pulse nor a gradient magnetic field is applied is received by switching at least one switch (selector switch 3215) provided in a section between the coil element 201 and the analog to digital converter 323 between on and off, and a signal of the first path where the coil element 201 and the analog to digital converter 323 are connected is compared with a signal of the second path where the coil element 201 and the analog to digital converter 323 are not connected to each other, thereby detecting an abnormality. For example, if the second path signal is a signal related to a coil port to which the RF coil apparatus 20 is not connected, the present MRI apparatus 1 can detect an abnormality in a path from a preamplifier and a switch (selector switch 3215).

Furthermore, in the coil ports 53 to which the RF coil apparatus 20 is connected, if the second path signal is a signal related to, among the plurality of terminals, the terminals to which the coil elements 201 are not connected, the present MRI apparatus 1 can detect an abnormality in the path from the coil element 201 to the terminal.

Furthermore, according to the MRI apparatus 1, by the processing from step Sa10 to step Sa14 in the abnormality detection function, after switching the input to the receive channel 325 from the terminator 3213 to a terminal, levels of output signals that are output when the decoupling switch 205 is in an on state (fourth noise levels) are compared with levels of output signals that are output when the decoupling switch 205 is in an off state (fifth noise levels), thereby detecting an abnormality in the path from the coil element 201 to the preamplifier 203. In other words, according to the MRI apparatus 1, with at least one RF coil apparatus 20 being connected to the coil ports 53, a signal detected by the RF coil apparatus 20 when neither RF pulse nor a gradient magnetic field is applied is received by switching at least one switch (decoupling switch 205) provided in a section between the coil element 201 and the analog to digital converter 323 between on and off, and with respect to the first path where the coil element 201 and the analog to digital converter 323 are connected, a signal of the first path obtained when the decoupling switch 205 is in an on state is compared with a signal of the first path obtained when the decoupling switch 205 is in an off state, thereby further detecting an abnormality in the path from the coil element 201 to the preamplifier 203.

In light of the foregoing, according to the MRI apparatus 1 of the present embodiment, if a malfunction occurs in any spot in the path from the RF coil apparatus 20 to the receive circuitry 32, it is possible to detect, from the output terminal side (the processing circuitry side) of the receive circuitry 32 toward the coil element 201, presence/absence of an abnormal spot (malfunction spot) in each of the plurality of sections of the path, which is divided into sections as a target for the abnormality detection. Thus, according to the present MRI apparatus 1, by connecting the RF coil apparatus 20 to the coil ports 53, a malfunction spot in the receive circuitry 32 of the MRI apparatus 1 or in the RF coil apparatus 20 can be easily and simply specified, without using a phantom.

Since the MRI apparatus 1 does not require a phantom for SNR measurement, it is possible to detect an abnormal (malfunction) spot in advance by carrying out the abnormality detection function during a time other than an examination time (e.g., during the night time) for the RF coil apparatus 20 which is connected to the coil ports 53 during the time other than the examination time. In other words, according to the present MRI apparatus 1, it is possible to detect an abnormality during a time other than a time of examining a subject P.

Furthermore, according to the MRI apparatus 1, it is possible to specify a malfunction spot by carrying out the abnormality detection function through a remote operation from the outside of the MRI apparatus 1, for example. If a malfunction occurs in any spot in the path from the RF coil apparatus 20 to the receive circuitry 32, it is thereby possible to show a malfunction spot to a serviceman before the serviceman heads to repair the MRI apparatus 1. For this reason, the serviceman can predict parts to be changed based on the malfunction spot before heading to repair the MRI apparatus 1, thereby responding to the malfunction promptly and reducing repair costs.

First Modification

Figure 9:
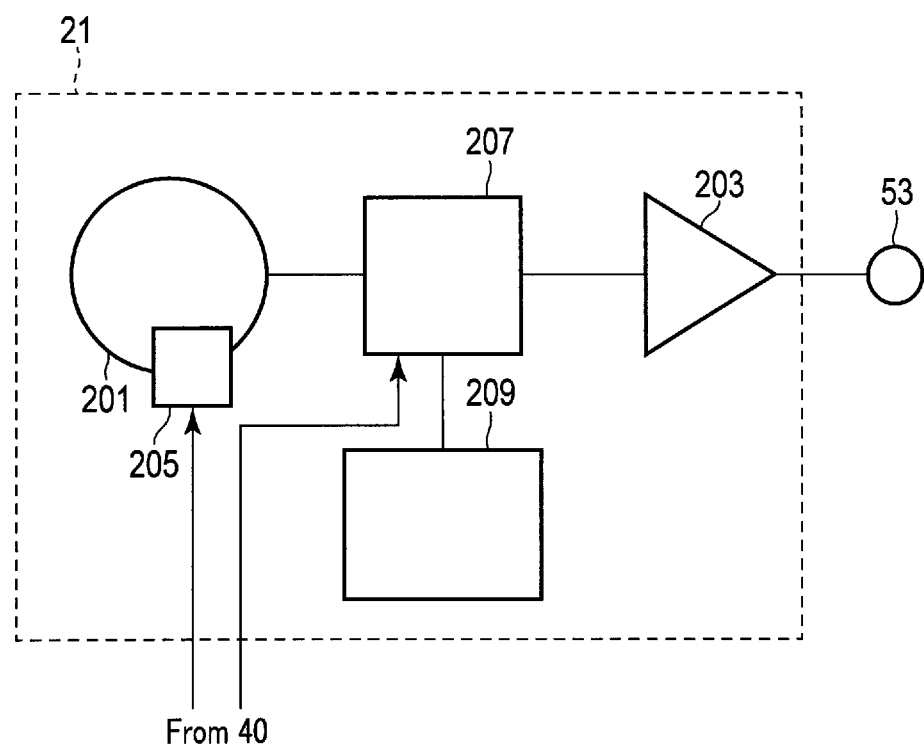
FIG. 9 is a diagram showing a configuration example of an RF coil apparatus according to a first modification of the present embodiment.

A difference of the first modification from the above-described embodiment lies in that the RF coil apparatus of the first modification further includes a different selector switch (hereinafter, element switch) for switching an input to the preamplifier 203 between a different terminator provided in the RF coil apparatus (hereinafter, preamplifier terminator) and the coil element 201. FIG. 9 is a schematic diagram showing a configuration example of the RF coil apparatus 21 according to the present modification. As shown in FIG. 9, the RF coil apparatus 21 further includes an element switch 207 and a preamplifier terminator 209 for each coil element 201.

The element switch 207 is provided between each of the plurality of coil elements 201 and the preamplifier 203. The element switch 207 is for switching between a connection of the coil element 201 with the preamplifier 203 and a connection of the preamplifier terminator 209 with the preamplifier 203. The element switch 207 switches the above connections by the switch function 401.

The preamplifier terminator 209 is provided at the end of the element switch 207. The preamplifier terminator 209 is a terminator of 50 Ω, for example. The preamplifier terminator 209 generates a signal in accordance with a thermal noise due to its temperature and resistance value.

While neither RF pulse nor a gradient magnetic field is being applied, a signal from the coil element 201 or a signal from the preamplifier terminator 209 is input to the receive circuitry 32 in accordance with the switching at the element switch 207.

In the following, differences of the abnormality detection function in the present modification from the processing (step Sa5 to step Sa9) in the above embodiment will be described.

(Step Sa5)

The processing circuitry 40 controls the selector switch 3215 in such a manner that each receive channel 325 is connected to each terminal by the switch function 401, and controls the element switch 207 in such a manner that the input to the preamplifier 203 is switched to the preamplifier terminator 209. By this control, the element switch 207 switches the input to the preamplifier 203 from the coil element 201 to the preamplifier terminator 209. When the input to the preamplifier 203 is switched from the coil element 201 to the preamplifier end 209, a signal generated at the preamplifier terminator 209 is input to the receive channel 325.

(Step Sa6)

A sixth noise generated in the preamplifier terminator 209 is input to the plurality of terminals in the coil port 53 to which the RF coil apparatus 21 is connected. With at least one RF coil apparatus 20 being connected to the coil ports 53, the receive circuitry 32 switches at least one switch (element switch 207) provided in a section between the coil elements 201 and the analog to digital converter 323 between on and off, and receives the sixth noise. At this time, the receive circuitry 32 outputs a sixth noise signal corresponding to the sixth noise to the processing circuitry 40. The processing circuitry 40 associates an averaged sixth noise signal (hereinafter, a sixth noise level) with a coil element 201 that is related to the preamplifier terminator 209 that is involved in generating a sixth noise, and stores the averaged sixth noise signal with the coil element.

By the above processing, the sixth noise level related to a coil port to which the RF coil apparatus 21 is connected and the third noise level related to a coil port to which the RF coil apparatus 21 is not connected are obtained.

(Step Sa7)

The processing circuitry 40 compares the sixth noise level with the third noise level by the detection function 403. Specifically, the processing circuitry 40 compares the noise levels between the coil port to which the RF coil apparatus 21 is connected and the coil port to which the RF coil apparatus 21 is not connected. More specifically, the processing circuitry 40 compares the noise levels between the coil ports and the receive channels in the receive channels connected to the terminals in the coil ports to which the RF coil apparatus 21 is connected and in the receive channels connected to the terminals in the coil ports to which the RF coil apparatus 21 is not connected.

(Step Sa8)

The processing circuitry 40 determines if there is a difference corresponding to a gain of the preamplifier 203 between the sixth noise level and the third noise level. If there is a difference corresponding to a gain of the preamplifier 203 between the sixth noise level related to the coil ports to which the RF coil apparatus 21 is connected and the third noise level related to the coil ports to which no RF coil apparatus 21 is connected (Yes in step Sa8), in other words, the sixth noise level and the third noise level are of approximately the same noise level, the processing in step Sa9 is performed. If there is any difference corresponding to a gain of the preamplifier 203 between the sixth noise level and the third noise level (No in step Sa8), the processing in step Sa10 is carried out.

(Step Sa9)

The processing circuitry 40 specifies a coil element that corresponds to the sixth noise level which is approximately the same as the third noise level. For the specified coil element, the processing circuitry 40 determines that the path between the preamplifier 203 and the selector switch 3215 inclusive is in an abnormal state.

To summarize the processing from step Sa1 to step Sa9 in the present modification, the processing circuitry 40 compares, by the detection function 403, with respect to the second path when the coil element 201 and the analog to digital converter 323 are not connected to each other, a signal of the second path obtained when the preamplifier 203 and the terminator (preamplifier terminator 209) are connected to each other in a coil port 53 to which the RF coil apparatus 20 is connected with a signal of the second path related to a coil port where the RF coil apparatus 20 is not connected, and the processing circuitry 40 detects an abnormality in the path from the preamplifier 203 to the analog to digital converter 323.

According to the above-described configuration, the following advantageous effects can be obtained in addition to the advantageous effects described in the present embodiment.

Furthermore, according to the MRI apparatus 1, by the processing from step Sa5 to step Sa9 in the abnormality detection function, after switching the input to the receive channel 325 from the terminator 3213 to the terminal and switching the input to the preamplifier 203 from the coil element 201 to a different terminator (preamplifier terminator 209), levels of output signals related to, among a plurality of the coil ports, the coil ports to which the RF coil apparatus 21 is connected (sixth noise levels) are compared with levels of output signals related to the coil ports to which the RF coil apparatus 21 is not connected (third noise levels), thereby detecting an abnormality in the path between the preamplifier 203 and the selector switch 3215 inclusive. In other words, according to the MRI apparatus 1, with at least one RF coil apparatus 20 being connected to the coil ports 53, a signal detected by the RF coil apparatus 20 when neither RF pulse nor a gradient magnetic field is applied is received by switching at least one switch (element switch 207) provided in a section between the coil element 201 and the analog to digital converter 323 between on and off, and with respect to the second path where the coil element 201 and the analog to digital converter 323 are not connected, a signal of the second path obtained when the preamplifier 203 and the terminator (preamplifier terminator 209) are connected in the coil port 53 to which the RF coil apparatus 20 is connected is compared with a signal of the second path related to the coil port to which the RF coil apparatus 20 is not connected, thereby further detecting an abnormality in the path from the preamplifier 203 to the preamplifier 323.

Since dispersion in impedance between the coil elements 201 thereby becomes ignorable, the sixth noise level is more stable than the second noise level, and the detection of an abnormality in the path from the preamplifier 203 to the selector switch 3215 becomes further easier, thereby improving accuracy in abnormality detection.

Second Modification

A difference of the present modification from the embodiment lies in that the selector switch 3215 is controlled in such a manner that a length of the path from the coil port 53 to the amplifier 3211 becomes approximately the same when the RF coil apparatus 20 is not connected to the coil port 53.

With the RF coil apparatus 20 being not connected to the coil ports 53, the processing circuitry 40 activates the abnormality detection function. With the RF coil apparatus 20 being not connected to the coil ports 53, the activation of the abnormality detection function may be carried out in accordance with an instruction that is externally input via the communication interface circuitry 44. When the abnormality detection function is activated, the processing circuitry 40 controls the selector switch 3215 by the switch function 401 in such a manner that the length of the path from the coil port 53 to the amplifier 3211 becomes approximately the same. The selector switch 3215 switches the connection of the receive channel 325 with the coil port 53 by the switch function 401 in such a manner that the length of the path from the coil port 53 to the amplifier 3211 becomes approximately the same.

According to the above-described configuration, the following advantageous effects can be obtained in addition to the advantageous effects described in the present embodiment.

According to the MRI apparatus 1 of the present modification, when the RF coil apparatus 20 is not connected to the coil ports 53, the selector switch 3215 is controllable in such a manner that a length of the path from the coil port 53 to the amplifier 3211 becomes approximately the same. Thus, for example, if the path from the coil port 53 to the amplifier 3211 is in a normal condition, the length of the path is approximately the same; as a result, the third noise level becomes approximately the same. For this reason, in the comparison of the plurality of third noise levels, if there is a third noise level that falls under outliers (abnormal value) in the third noise levels, it can be determined that an abnormality, such as a disconnection, occurs in the path from the coil port 53 to the amplifier 3211, and it can be determined that there is a difference between impedance in a normal path and impedance in an abnormal path.

According to the MRI apparatus 1 of the above-described embodiment and one of the above-described modifications, an abnormality can be detected. In other words, the present MRI apparatus 1 can isolate an abnormality to the RF coil apparatus 20 on the system side when a malfunction occurs, and can improve service when a malfunction occurs in the MRI apparatus 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus comprising:
    an RF coil apparatus having a coil element;
    a coil port to which the RF coil apparatus is connectible;
    receive circuitry that receives a signal detected by the RF coil apparatus via the coil port when neither an RF pulse nor a gradient magnetic field is being applied, and that performs analog to digital conversion with an analog to digital converter; and
    processing circuitry that detects an abnormality based on the signal received by the receive circuitry,
    wherein
    with at least one RF coil apparatus being connected to the coil port, the receive circuitry switches at least one switch provided in a section between the coil element and the analog to digital converter between on and off, and receives the signal, and
    the processing circuitry compares a signal of a first path where the coil element and the analog to digital converter are connected with a signal of a second path where the coil element and the analog to digital converter are not connected, and detects the abnormality.

2. The magnetic resonance imaging apparatus according to claim 1, wherein
    the RF coil apparatus includes a preamplifier that amplifies an output from the coil element,
    the signal of the second path is a signal related to a coil port to which the RF coil apparatus is not connected, and
    the processing circuitry detects an abnormality in a path from the preamplifier to the switch as the abnormality.

3. The magnetic resonance imaging apparatus according to claim 2, wherein the switch is a decoupling switch that disconnects an electronic coupling in the coil element, and the processing circuitry compares a signal of the first path obtained when the decoupling switch is in an on state with a signal of the first path obtained when the decoupling switch is in an off state with respect to a same coil element, and further detects an abnormality in a path from the coil element to the preamplifier.

4. The magnetic resonance imaging apparatus according to claim 2, wherein the switch is an element switch that switches an input to the preamplifier to a connection of a terminator provided in the RF coil apparatus with the coil element, and the processing circuitry compares a signal of the second path obtained when the preamplifier and the terminator are connected in a coil port to which the RF coil apparatus is connected with a signal of the second path related to a coil port to which the RF coil apparatus is not connected, and further detects an abnormality in a path from the preamplifier to the analog to digital converter.

5. The magnetic resonance imaging apparatus according to claim 1, wherein the coil port has a plurality of terminals, the signal of the second path is a signal related to, among the plurality of terminals, a terminal to which the coil element is not connected in the coil port to which the RF coil apparatus is connected, and the processing circuitry detects an abnormality in a path from the coil element to the terminal as the abnormality.

6. The magnetic resonance imaging apparatus according to claim 1, wherein the receive circuitry further includes an amplifier provided in a path between the analog to digital converter and the switch, and the signal of the first path and the signal of the second path are signals that are output via the amplifier.

7. The magnetic resonance imaging apparatus according to claim 1, wherein the processing circuitry carries out detection of the abnormality during a time other than a time of examining a subject.

8. The magnetic resonance imaging apparatus according to claim 1, wherein the processing circuitry obtains a level of a signal of the first path by averaging the signal of the first path over a predetermined period of time, obtains a level of a signal of the second path by averaging the signal of the second path over the predetermined period of time, compares the level of the signal of the first path with the level of the signal of the second path, and detects the abnormality.

9. A magnetic resonance imaging apparatus comprising:

an RF coil apparatus that includes a coil element, a preamplifier that amplifies an output from the coil element, and a decoupling switch that disconnects an electric coupling in the coil element;

a coil port to which the RF coil apparatus is connected;

receive circuitry that receives, via the coil port, a magnetic resonance signal that is generated by applying an RF pulse and a gradient magnetic field to a phantom placed in an imaging space, receives detection signals that is detected by the RF coil apparatus when the RF pulse and the gradient magnetic field are not applied, and performs analog to digital conversion with an analog to digital converter;

processing circuitry that measures a signal to noise ratio of the phantom based on the magnetic resonance signal, and if the signal to noise ratio is of a value smaller than a specification value, detects an abnormality based on the detection signal; and a display that displays the abnormal spot, wherein the receive circuitry receives the detection signals by switching at least one switch provided in a section between the coil element and the analog to digital converter between on and off, and the processing circuitry, among the detection signals, compares a signal of a first path where the coil element and the analog to digital converter are connected with a signal of a second path where the coil element and the analog to digital converter are not connected, and detects the abnormality, and the processing circuitry compares a signal of the first path obtained when the decoupling switch is in an on state with a signal of the first path obtained when the decoupling switch is in an off state with respect to a same coil element, and further detects an abnormality in a path from the coil element to the preamplifier.

10. An abnormality detection method, comprising:

receiving, via a coil port to which an RF coil apparatus is connected, a signal detected by the RF coil apparatus when an RF pulse and a gradient magnetic field are not applied, the RF coil apparatus comprising a coil element, a preamplifier that amplifies an output from the coil element, and a decoupling switch that disconnects an electric coupling in the coil element, and performing analog to digital conversion with an analog to digital converter; and detecting an abnormality based on the received signal, wherein the receiving of the signal is performed by switching at least one switch provided in a section between the coil element and the analog to digital converter between on and off, and the detecting of an abnormality further comprises:

detecting an abnormality by comparing a signal of a first path where the coil element and the analog to digital converter are connected with a signal of a second path where the coil element and the analog to digital converter are not connected; and further detecting an abnormality in a path from the coil element to the preamplifier by comparing a signal of the first path obtained when the decoupling switch is in an on state with a signal of the first path obtained when the decoupling switch is in an off state with respect to a same coil element.

* * * * *